(12) United States Patent
Royer, Jr. et al.

(10) Patent No.: US 7,328,304 B2
(45) Date of Patent: Feb. 5, 2008

(54) INTERFACE FOR A BLOCK ADDRESSABLE MASS STORAGE SYSTEM

(75) Inventors: Robert J. Royer, Jr., Portland, OR (US); Robert W. Faber, Hillsboro, OR (US); John I. Garney, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 445 days.

(21) Appl. No.: 10/788,717

(22) Filed: Feb. 27, 2004

(65) Prior Publication Data

US 2005/0193164 A1 Sep. 1, 2005

(51) Int. Cl.
*G06F 12/00* (2006.01)
*H03M 13/00* (2006.01)

(52) U.S. Cl. ...................... 711/113; 711/103; 711/104; 711/106; 714/754

(58) Field of Classification Search ..................... None
See application file for complete search history.

(56) References Cited

U.S. PATENT DOCUMENTS 5,438,614 A * 8/1995 Rozman et al. .......... 379/93.08
2005/0071543 A1 * 3/2005 Ellis et al. ................. 711/106

* cited by examiner

*Primary Examiner*—Reginald Bragdon
*Assistant Examiner*—Mehdi Namazi

(57) ABSTRACT

A host controller interface to manage the complexity of accessing mass storage that takes into account the special handling needs of various memory technologies such as polymer memories.

32 Claims, 3 Drawing Sheets

INTERFACE FOR A BLOCK ADDRESSABLE MASS STORAGE SYSTEM

There are several interfaces in use today for mass storage devices to facilitate data accesses between the processor and the cache mass storage. A direct memory mapped interface and a standard block addressable interface have been used for mass storage devices, but neither is suited for a disk cache. What is needed is an interface that can improve system performance for a disk cache.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
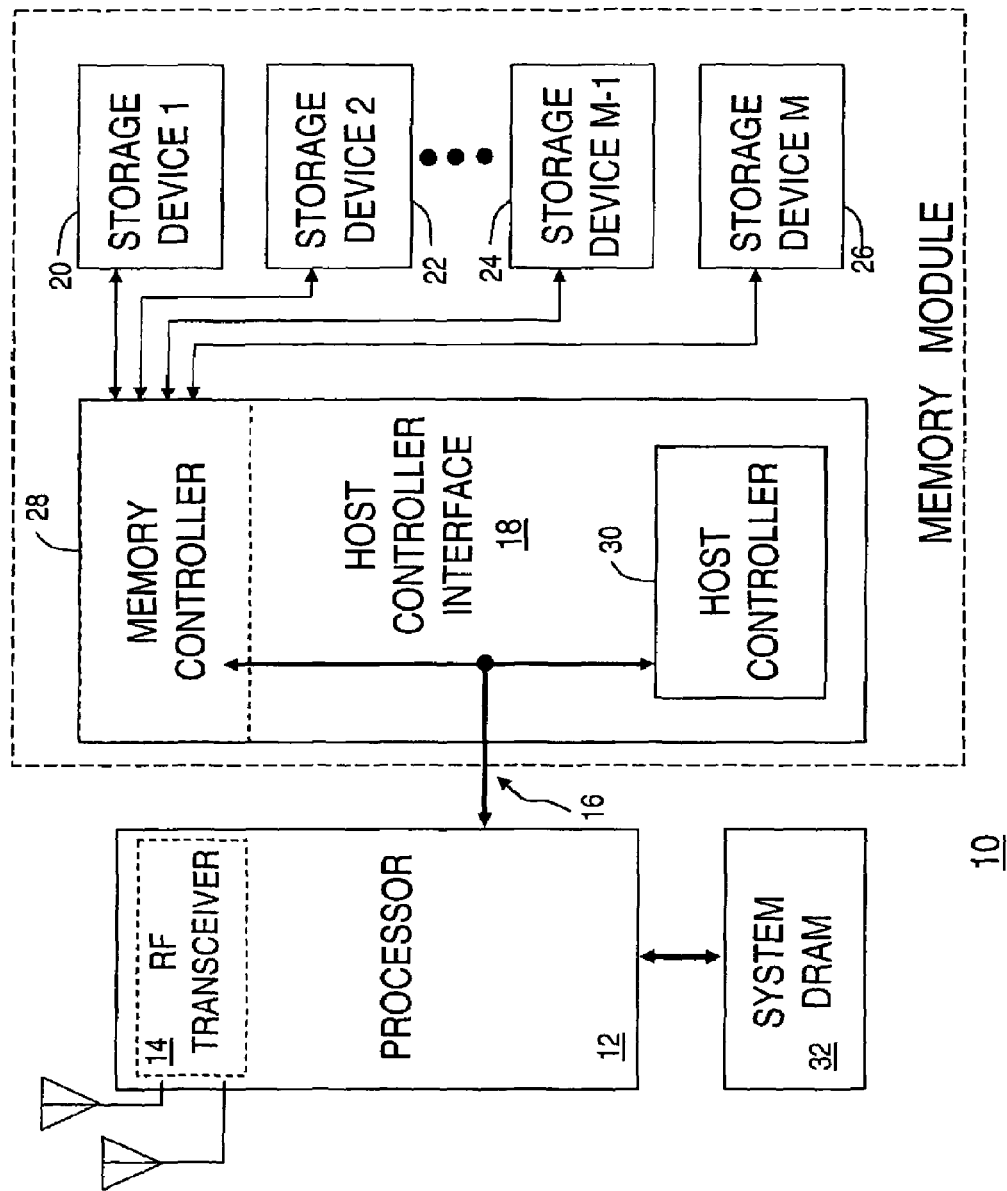
FIG. 1 illustrates a device having an interface between a processor and mass storage devices in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

FIG. 1 illustrates a device 10 that may include a transceiver 14 that either receives or transmits a modulated signal from one or more antennas. The analog front end transceiver may be a stand-alone Radio Frequency (RF) integrated analog circuit, or alternatively, embedded with processor 12 as a mixed-mode integrated circuit. The received modulated signal is frequency down-converted, filtered, then converted to a baseband, digital signal. The digital data processed by processor 12 may be transferred across an interface 16 for storage by storage devices 20, 22, . . . , 24 and 26 on a memory module. It should be understood that storage devices 20, 22, . . . , 24 and 26 may be used as a cache. A Network Interface Card (NIC) may facilitate the transfer of data across interface 16 and may incorporate a Peripheral Component Interconnect (PCI) bus as defined by the PCI Local Bus Specification, dated in June, 1995, or alternately, a bus such as the PCI Express bus or any other high bandwidth bus.

By way of example and for ease of description, the memory module shown in FIG. 1 has four storage devices 20, 22, 24 and 26. In one embodiment, each of the four storage devices may have a memory size of 256 Mbyte, but neither the size of the storage devices nor the number of devices that populate the memory module are a limitation of the present invention. Further, storage devices 20, 22, 24 and 26 may be packaged separately, stacked as multiple memory devices in one package or integrated together and addressable as separate blocks of memory. Storage devices 20, 22, . . . , 24 and 26 may store both data processed by processor 12 and metadata used by the memory management system for administrative purposes. The memory module has support to access data-only or independently accessible metadata-only or data plus metadata.

A memory controller 28 on the memory module is connected via address and control buses to the storage devices. Memory controller 28 retrieves and processes current commands, and when processing is completed, a command status is appropriately set. Memory controller 28 further implements a memory mapping algorithm to improve the performance of device 10. Note that a host controller 30 is connected with a Host Controller Interface (HCI)18, memory controller 28, and processor 12.

In one embodiment, storage devices 20, 22, 24 and 26 may be a relatively large non-volatile disk cache memory adapted to cache information for a mass store system (not shown) coupled to processor 12. The mass store system typically has a storage capacity, for example, of at least about one gigabyte. The mass storage system may be an electromechanical hard disk memory, an optical disk memory, or a magnetic disk memory, although the scope of the present invention is not limited in this respect.

In one embodiment, storage devices 20, 22, . . . , 24 and 26 may be polymer memory having a storage capacity of at least about 250 megabytes and may include ferroelectric memory cells, wherein each cell includes a ferroelectric polymer material located between at least two conductive lines. In this embodiment the ferroelectric polymer material may be a ferroelectric polarizable material and include a ferroelectric polymer material comprised of a polyvinyl fluoride, a polyethylene fluoride, a polyvinyl chloride, a polyethylene chloride, a polyacrylonitrile, a polyamide, copolymers thereof, or combinations thereof.

In an alternate embodiment, storage devices 20, 22, . . . , 24 and 26 may be a polymer memory such as, for example, a plastic memory or a resistive change polymer memory. In this embodiment, the plastic memory may include a thin film of polymer memory material sandwiched at the nodes of an address matrix. The resistance at any node may be altered from a few hundred ohms to several megohms by an electric potential supplied across the polymer memory material and a positive or negative current flowing in the polymer material that alters the resistance of the polymer material. Potentially, different resistance levels may store several bits per cell and data density may be increased further by stacking layers. In addition to polymer memory, cache storage devices may be a NOR or NAND Flash or battery backed-up DRAM.

Embodiments of the present invention for device 10 may be used in a variety of applications, with the claimed subject matter incorporated into microcontrollers, general-purpose microprocessors, Digital Signal Processors (DSPs), Reduced Instruction-Set Computing (RISC), Complex Instruction-Set Computing (CISC), among other electronic components. In particular, the present invention may be used in smart phones, communicators and Personal Digital Assistants (PDAs), medical or biotech equipment, automotive safety and protective equipment, and automotive infotainment products. However, it should be understood that the scope of the present invention is not limited to these examples.

Figure 2:
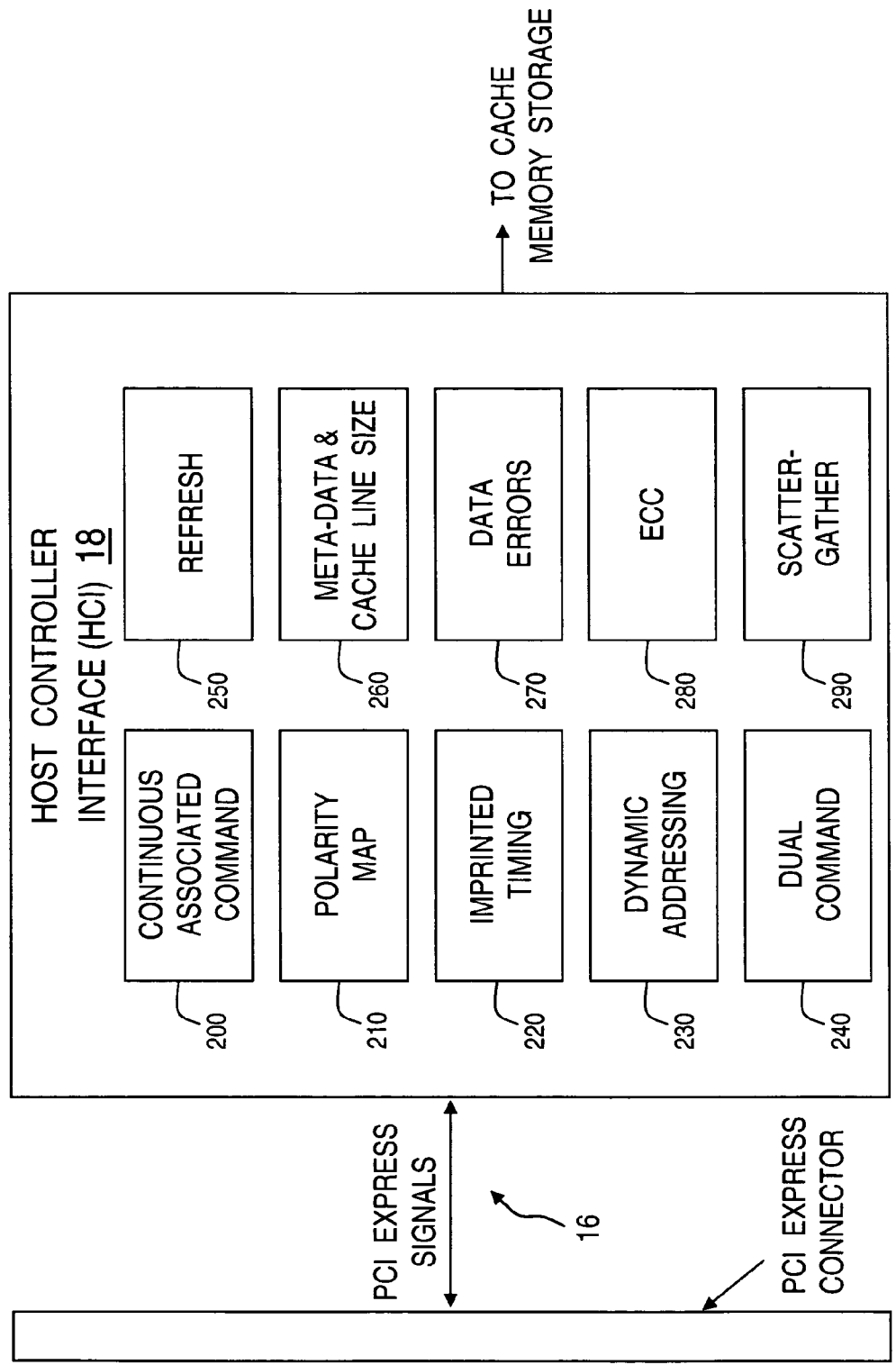
FIG. 2 is a diagram that highlights features of the present invention.

FIG. 2 illustrates a Host Controller Interface (HCI) 18 that in this embodiment has an add-in card for PCI-Express bus transfers across interface 16, but note that other embodiments may adopt other busses. In general, the memory module hardware in HCI 18 processes lists of software created commands that may be issued without processor 12 involvement until the module hardware signals process completion. Memory data stored by cache storage devices 20, 22, . . . , 24 and 26 on the memory module is not directly accessible by CPU instructions. The cache stored data may be copied to/from system memory 32 such as, for example, Dynamic Random Access Memory (DRAM).

The memory module is a bus master device that is given lists of commands to asynchronously process. A command identifies a buffer in system memory used to hold the data associated with a command. Thus, HCI 18 provides a memory module programming interface capable of streaming read/write data across interface 16 without direct CPU instruction access to the cache storage devices. In other words, HCI 18 is not a direct, memory-like interface to access memory storage.

The present invention includes an interface (HCI 18) positioned between a processor and mass storage devices. HCI 18 provides associated functions and services required to support the mass storage devices, with various features of the present invention implemented in either hardware or software. In various embodiments, HCI 18 may include all or a subset of the described features.

As shown in FIG. 2, the present invention includes features such as a continuous associated command 200 that allows a group of commands to be issued together; a polarity map mechanism 210, a timing control 220 and a dynamic addressing 230 designed to support characteristics of Polymer Ferroelectric Memory (PFEM) memory technology; a multi-control command 240 to optimize performance for a disk caching environment; a refresh 250; a meta-data size & cache line size 260 that provides memory word read/write operations; a data errors 270 and Error Correction Code (ECC) correction 280 for reporting memory errors; and an optimized scatter gather list 290 to improve system performance.

Continuous Associated Command 200

FIG. 2 includes a continuous associated command 200 issued within HCI 18 that is designed for cache accesses. User requests for data from cache storage devices 20, 22, . . . , 24 and 26 may require that multiple cache lines be accessed to fulfill the request. Due to the nature of set associative cache mapping algorithms, a request for continuous disk sectors may not necessarily map to continuous cache lines. (FIG. 3 illustrates continuous disk sectors mapped to different cache lines.)

HCI 18 defines a command list structure in system memory and a doorbell register (not shown) that allows a group of commands to be issued together. Each command includes at least one bit to indicate if the command is active and a pointer to the next command. Upon receiving a pointer to the start of the command chain and having the doorbell 'rung', HCI 18 will fetch a command, process the command and advance to the next command until a non active command is found. Additional commands may be inserted at the end of the chain to ensure that the cache hardware is always active if outstanding requests exist. A further optimization may be made to allow software to specify whether an interrupt should be generated when the command completes. This programmable interrupt bit allows a command list to be structured such that only one interrupt is generated per group of associated commands, which minimizes system overhead.

Figures 3, 4:
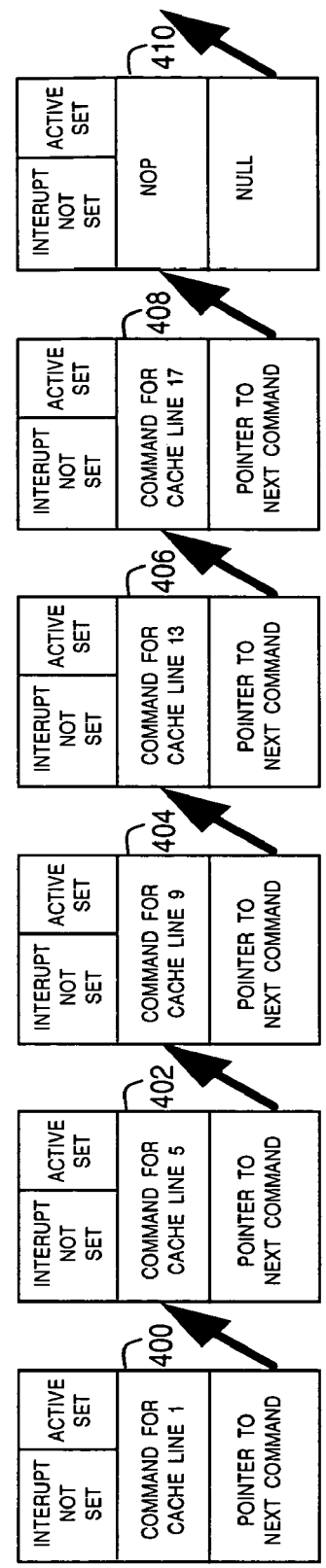
FIG. 3 shows a five cache line disk request.
FIG. 4 shows a command sequence for the request in FIG. 3.

FIG. 4 illustrates hardware and software activity related with the continuous associated command 200. A list of commands is shown, for example, as commands 402, 404, 406 and 408. Each command includes at least one bit to indicate if the command is active (labeled ACTIVE SET) and the pointer to the next command. The diagram further illustrates that commands are fetched and processed, and advancement to the next command continues until a non active command 410 is found.

Polarity Map Mechanism 210

FIG. 2 shows a polarity map 210 to support characteristics of PFEM memory technology within HCI 18. Data may be written into memory cells in any of cache storage devices 20, 22, . . . , 24 and 26 by controlling the voltages on selected word lines and bit lines. The memory cell may be programmed to either a "physical 0" state or a "physical 1" state, but memory controller 28 (see FIG. 1) may interpret whether the physical value of a storage cell read represents a 1 state or a 0 state. Various memory technologies may have different requirements for representation of the stored state, and accordingly, memory controller 28 is designed with a software controller polarity management mechanism that determines how polarity is to be dealt with for the specific access. In one embodiment software specifies the polarity mechanism on each read/write operation, although in alternate embodiments the polarity mechanism may be applied on a global basis through multiple operation control. Three polarity management mechanisms may be specified to ensure that each time data is stored in a memory word, the polarity used is opposite of that last used for the memory word.

A first polarity management mechanism provides 'explicit polarity control' where software specifies a TRUE/COMPLEMENT polarity indicator for each write and memory controller 28 recovers the polarity state from the storage location on a read. Data in system memory is always in TRUE polarity representation. Software doesn't need to make any transformations of data stored in the memory module in COMPLEMENT polarity. Memory controller 28 depends on software to do any required toggling.

Another polarity management mechanism for 'recovered polarity' allows memory controller 28 to use the "last" polarity determined from a read operation to do a subsequent write operation.

Software may specify "automatic polarity" for an access as another polarity management mechanism. Memory controller 28 keeps a separate volatile polarity map (kept in RAM) that has a polarity state for each word of the memory module, i.e., each storage location or group of cells. During normal runtime, memory controller 28 uses the contents of the polarity map to determine polarity on reads and toggles the polarity in the map for writes. No recovery of polarity is required for reads. Software is required to load the polarity map before any automatic polarity mechanism is used (other mechanisms could be used before this). On system shutdown, software is responsible to read the polarity map from the memory controller and save it to some other non volatile storage media.

Timing Control 220

FIG. 2 shows a timing control 220 to support characteristics of PFEM memory technology within HCI 18. Different memory technologies may require different detailed hardware cycle timings for specific aspects of read/write operations to access stored values. For example, delays or pauses may be used for polymer memory technologies during reading and writing to the memory to avoid changes in cell polarization. Further, depending on whether the requested address is in the same memory segment as the last memory operation, a delay operation may or may not be performed. Certain memory technologies may require slower timings for locations that haven't been accessed for some time period, with either slow or fast timings specified to be used for a given read/write operations to memory locations. Accordingly, memory controller 28, under software control, may specify on a per operation basis what timings should be used for read/write operations.

Dynamic Addressing 230

FIG. 2 shows a dynamic addressing 230 to support characteristics of PFEM memory technology within HCI 18. A read cycle for the polymer memory devices in cache storage devices 20, 22, . . . , 24 and 26 may be destructive and polarize electric dipoles in the polymer film material in one direction. Since information stored at a particular physical address of the memory may be lost during the destructive read operation, the information may be written back to the memory to restore the data. Thus, to read information from such a destructive read memory, a read cycle may include a subsequent write back operation. Within a segment of memory in a cache storage device there may be a vulnerability to writes following reads. The vulnerability imposes a performance penalty such as waiting to perform the write back until the vulnerability passes. However, in accordance with the present invention, HCI 18 provides an algorithm allowing data that was read to be written to a location in a different segment.

Accordingly, one feature of the present invention is that HCI 18 includes two addresses for every access, one address for a read and another address for the write. Thus, every interface level access operates on two locations, ideally in different segments of the memory. A read operation specifies an address to read plus a blank location where the data may be written back. The read operation consumes a blank and creates a blank. The write operation specifies an address to erase (make blank) and an address that is already blank which is the destination for the write data.

Multi-Control Command 240

FIG. 2 shows a multi-control command 240 issued within HCI 18 to optimize performance for a disk caching environment. Briefly referring to FIG. 1, HCI 18 provides the interface between commands issued by processor 12 and the operation of the M memory storage devices connected to memory controller 28. HCI 18 includes a multi-control command feature that allows software to issue the same operation or a different operation to multiple cache storage devices 20, 22, . . . , 24 and 26 on the memory module card. The multi-command feature allows one command packet which can share common data and can be transferred more efficiently over PCI-express to be fetched, decoded, executed and potentially provide different memory operations for each cache storage device on the card.

The multi-control command feature allows each cache storage device to address different address locations with potentially different operation types. By way of example, memory controller 28 may perform a read cycle that includes a destructive read operation within cache storage device 20 while simultaneously issuing a write operation to another device such as cache storage device 22. Thus, multi-commands access memory words in different cache storage devices. When a multiple cache storage device access is specified, each access may have unique operation parameters. Most memory accesses include an operation, a block count, and two block addresses along with other operation specific parameters for the command.

Refresh 250

FIG. 2 shows a refresh 250 to support characteristics of PFEM memory technology within HCI 18. HCI 18 allows both time-based and cycle-based refresh cycles. Time-based refresh is similar to DRAM refresh in that the stored data is accessed periodically. Whereas, DRAM devices provide a refresh cycle to pump up leaking capacitors, the time-based refresh prevents the polymer memory devices in cache storage devices 20, 22, . . . , 24 and 26 from becoming "imprinted" or stuck in a current state. HCI 18 provides an initial loop through all addresses at power up, followed by normal access time reads at regular time intervals to ensure that cells do not become imprinted during power on time.

If information read from a requested address is written back to the same address, neighboring unselected memory cells sharing the same word line or bit lines as the selected memory cell may experience "disturbances". An interaction of the electrode material with the polymer memory material in a memory cell may result in a disturbance of the polarization if the memory operations are performed within a relatively short period of time. Thus, accesses to one location in a segment of memory may result in disturbances to other locations within the segment. Each disturb erodes the stored charge in the memory, and after N disturbs the stored data is read to ensure a reliable read operation. Thus, HCI 18 provides cycle-based refresh addresses inserted every N cycles to bound the effects of a disturb and to limit each location within the segment to N disturbs.

Meta-Data Size & Cache Line Size 260

FIG. 2 shows a meta-data size & cache line size 260 that provides memory operations within HCI 18. The PFEM memory controlled by HCI 18 has the ability to atomically read/write meta-data and data for each cache line. In order to do this hardware must know the size of both the cache line and meta-data. A set of registers (not shown) are defined within HCI 18 to store the minimum and maximum cache line size and the metadata size, along with sizes that provide optimal hardware performance as determined by cache policies in software. Using these size values, HCI 18 is programmed to use the size values that best match the cache policy needs.

Data Errors 270

FIG. 2 shows a data errors 270 for error detection within HCI 18. Data corruption may occur during the periodic memory refresh cycles for PFEM. PFEM memory is a destructive read memory technology and any errors that occur during the refresh cycle will leave the memory in an unknown state. A read operation on the memory location that has an error may potentially return incorrect data that will not be detected by Error Correcting Code (ECC). To prevent errors from being undetected during the refresh cycle, HCI 18 defines a set of registers (not shown) and an interrupt that allow memory controller 28 to interrupt the software controlling cache storage devices 20, 22, . . . , 24 and 26 and report the memory refresh failure. Software may then mark the corresponding cache line as bad and proceed with system operations.

ECC Correction 280

FIG. 2 shows an Error Correcting Code (ECC) 280 for error correction within HCI 18. The hardware implements an ECC method as part of data storage and retrieval. The hardware maintains an error log of all corrections and may be accessed by cache policy software to explicitly determine the results of ECC corrections made during memory accesses. The correction log may be accessed by issuing a command through the normal command process that downloads the correction log into system memory. The correction log may be used by cache policy as an early indication of a possible cache line failure, allowing appropriate corrective steps to be taken to avoid data loss.

Optimized Scatter Gather List 290

FIG. 2 shows an optimized Scatter Gather (SG) list 290 to improve system performance. Cache lines may span multiple 4 Kbyte physical system memory pages (a typical cache line is 8 Kbytes long), a scatter gather list correctly DMAs data from the cache line into system memory since the operating system makes no assurances of the buffer being physically contiguous. The scatter gather mechanism used by HCI 18 takes advantage of the fact that each command transfers one cache line worth of data, which allows for optimizations to be made to the scatter gather list. By way of example, very few entries are needed to fulfill a worse case request and a 16 Kbyte cache line at most spans five physical system memory pages. HCI 18 defines the scatter gather list that resides in the command and advances to the next entry when a system memory page is crossed (4 Kbyte boundaries). The scatter gather list as defined allows for simplifications to be made in the controller logic for the cache. This reduces the cost of the controller plus provides performance benefits by the elimination of an extra system memory DMA request by the cache controller needed to get a separate scatter gather list. An additional memory address is provided to indicate the location of metadata for the cache line, this allows the command to update both data and metadata in the same command atomically.

By now it should be apparent that the complexity of accessing a disk cache may be mitigated using features of the present invention. The host control interface takes into account the special handling needs of various memory technologies such as, for example, polymer memories.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A system, comprising:
    a processor;
    a nonvolatile mass storage device; and
    a host control interface to couple the processor to the nonvolatile mass storage device and issue read/write commands to manage polarity.

2. The system of claim 1 wherein the nonvolatile mass storage device is a disk cache.

3. The system of claim 1 wherein the nonvolatile mass storage device has polymer memory devices.

4. The system of claim 3 wherein the nonvolatile mass storage device having polymer memory devices is a disk cache.

5. The system of claim 1 wherein polarity management ensures that data is stored in the nonvolatile mass storage device with a polarity opposite of that last used for a memory word.

6. The system of claim 1 wherein polarity management includes an explicit polarity control with a polarity indicator to determine data polarity for each write.

7. The system of claim 1 wherein polarity management includes a recovered polarity that uses a last polarity from a read operation for a subsequent write operation.

8. The system of claim 1 wherein polarity management includes an automatic polarity where contents of a polarity map determine polarity on reads and polarity in the polarity map is toggled for writes.

9. A system comprising:
    a processor;
    addressable mass storage devices; and
    a host controller interface to couple processor commands to the addressable mass storage devices and issue read/write commands to manage polarity.

10. The system of claim 9 wherein a host controller detects an error and reports a number of error corrections.

11. The system of claim 9 wherein a polarity map is used to determine how polarity is to be handled for a specific access.

12. A system comprising:
    a processor having a transceiver coupled to dual antennas; and
    a memory module coupled to the processor that is a bus master device having a list of commands to asynchronously process, the memory module including,
        (a) a memory controller,
        (b) storage devices to form a mass storage that is coupled to the memory controller, and
        (c) a host controller coupled to the processor to provide a refresh cycle issued through an interface to the storage devices.

13. The system of claim 12 wherein the storage devices are polymer memory devices.

14. The system of claim 12 wherein the storage devices are flash memory devices.

15. The system of claim 12 wherein the list of commands are processed without involvement by the processor.

16. The system of claim 12 wherein data stored by the storage devices on the memory module is not directly accessible by processor instructions.

17. The system of claim 16 wherein the data stored by the storage devices on the memory module is copied to/from system memory.

18. A method including functions in a host control interface to facilitate read/write operations in a mass storage to include at least one of:
    (a) providing a continuous associated command to allow a group of commands to be issued together,
    (b) using a polarity map to determine how polarity is to handled for a specific access to the mass storage,
    (c) using a timing control to specify on a per operation basis what timings should be used for read/write operations, (d) using dynamic addressing to write data to a location in a different segment from where the data was read,
(e) issuing a multi-command to allow different operations to multiple storage devices in the mass storage,
(f) providing a refresh cycle,
(g) recording a number or corrections applied to the mass storage, and
(h) using a scatter gather list to correctly access data in the mass storage.

19. The method of claim 18, wherein facilitating read\write operations in the mass storage includes using the mass storage having a ferroelectric polarizable material.

20. The method of claim 18, wherein facilitating read\write operations in the mass storage includes using the mass storage having a resistive change polymer memory.

21. The method of claim 18, wherein facilitating read\write operations in the mass storage further includes facilitating read\write operations in a polymer storage.

22. The method of claim 18, wherein facilitating read\write operations in the mass storage further includes facilitating read\write operations in a disk cache.

23. The method of claim 22 further includes storing a minimum and maximum cache line size and metadata size in the disk cache.

24. A method of error reporting, comprising:
providing a periodic memory refresh cycle for storage devices; and
allowing a memory controller to detect an error and interrupt the software controlling the storage devices to report a memory refresh failure.

25. The method of claim 24 further including:
incorporating Polymer Ferroelectric Memory (PFEM) devices for the storage devices.

26. The method of claim 24 wherein providing the periodic memory refresh cycle for storage devices further includes providing the periodic memory refresh cycle for cache storage devices.

27. An article comprising a machine-readable storage medium containing instructions that if executed enable a host controller interface to control read/write operations for mass storage that include at least one of:
providing a continuous list of commands to allow a group of commands to be issued together;
using a polarity map to determine how polarity is to be handled for a specific access of the mass storage;
using a timing control to specify on a per operation basis what timing should be used for read/write operations;
using dynamic addressing to write data to a location in a different segment of the mass storage from where the data was read;
issuing a multi-command to allow different operations to multiple devices in the mass storage;
providing a refresh cycle; and
reporting a number of memory error corrections.

28. The article of claim 27 wherein the mass storage is a flash memory.

29. The article of claim 27 wherein the mass storage is a polymer storage.

30. The article of claim 29 wherein the polymer storage includes a ferroelectric polarizable material.

31. The article of claim 29 wherein the polymer storage includes a resistive change polymer memory.

32. The article of claim 29 wherein the mass storage is a disk cache.

* * * * *